United States Patent
Kanagawa (12)

(10) Patent No.: US 9,105,356 B2
(45) Date of Patent: Aug. 11, 2015

(54) SEMICONDUCTOR DEVICE

(71) Applicant: KABUSHIKI KAISHA TOSHIBA, Tokyo (JP)

(72) Inventor: Naoaki Kanagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 14/016,187

(22) Filed: Sep. 2, 2013

(65) Prior Publication Data
US 2014/0177351 A1    Jun. 26, 2014

(30) Foreign Application Priority Data

Dec. 25, 2012  (JP) .................................. 2012-281741

(51) Int. Cl.
| | |
|---|---|
| *G11C 29/02* | (2006.01) |
| *G11C 7/02* | (2006.01) |
| *G11C 16/30* | (2006.01) |
| *G11C 16/00* | (2006.01) |

(52) U.S. Cl.
CPC ................ *G11C 29/021* (2013.01); *G11C 7/02* (2013.01); *G11C 16/30* (2013.01); *G11C 29/028* (2013.01); *G11C 16/00* (2013.01)

(58) Field of Classification Search
CPC .......... G11C 16/00; G11C 7/02; G11C 16/30; G11C 29/021; G11C 29/028; G11C 7/12; G11C 8/08; G11C 11/4085
USPC .................................................... 365/189.07
See application file for complete search history.

(56) References Cited

U.S. PATENT DOCUMENTS

| | | | |
|---|---|---|---|
| 6,677,801 B2 | 1/2004 | Shimomura | |
| 8,705,273 B2 * | 4/2014 | Kim et al. | ................ 365/185.03 |
| 2003/0112676 A1 * | 6/2003 | Ooishi | .......................... 365/201 |
| 2007/0008795 A1 * | 1/2007 | Tsukada | ...................... 365/203 |
| 2008/0157730 A1 * | 7/2008 | Kim et al. | ...................... 323/234 |
| 2009/0096510 A1 * | 4/2009 | Ogiwara et al. | .............. 327/539 |
| 2011/0221513 A1 | 9/2011 | Fujisawa et al. | |

FOREIGN PATENT DOCUMENTS

| | | |
|---|---|---|
| JP | 2002083494 A | 3/2002 |
| JP | 2002-312042 A | 10/2002 |
| JP | 2003243516 A | 8/2003 |

\* cited by examiner

*Primary Examiner* — Richard Elms
*Assistant Examiner* — Khamdan Alrobaie
(74) *Attorney, Agent, or Firm* — Patterson & Sheridan, LLP

(57) ABSTRACT

A semiconductor device includes a first transistor connected to an internal voltage terminal and a first node at which a first resistance unit is connected. The first resistance unit includes a resistor connected between the first node and a node from which a monitoring voltage is provided for controlling the first transistor. This resistance unit also includes a first resistance adjustment unit connected in parallel with the first resistor. Also included is a second resistance unit having a third resistor connected between the monitor node and a second node which is connected to a ground potential and a second resistance adjustment unit connected in parallel with the third resistor. A comparator comparing the monitor node voltage to a reference is provided with an output terminal connected the first transistor. Also included is a control circuit to control the resistance adjustment units.

20 Claims, 14 Drawing Sheets

SEMICONDUCTOR DEVICE

CROSS-REFERENCE TO RELATED APPLICATION

This application is based upon and claims the benefit of priority from Japanese Patent Application No. 2012-281741, filed Dec. 25, 2012; the entire contents of which are incorporated herein by reference.

FIELD

Embodiments described herein relate generally to a semiconductor device, and in particular, to a step-down circuit of a semiconductor memory device.

BACKGROUND

In a semiconductor device such as a volatile semiconductor memory device or a non-volatile semiconductor memory device, a plurality of types of voltage are required in order to perform the operations of writing and reading data. Therefore, in order to generate a plurality of voltages from a single internal voltage, a step-up circuit and a step-down circuit are disposed in the semiconductor device.

In recent years, there has developed a need for the speed of the operation of a semiconductor device to be improved and accordingly, for the required voltage to be generated quickly.

DETAILED DESCRIPTION

Figure 1:
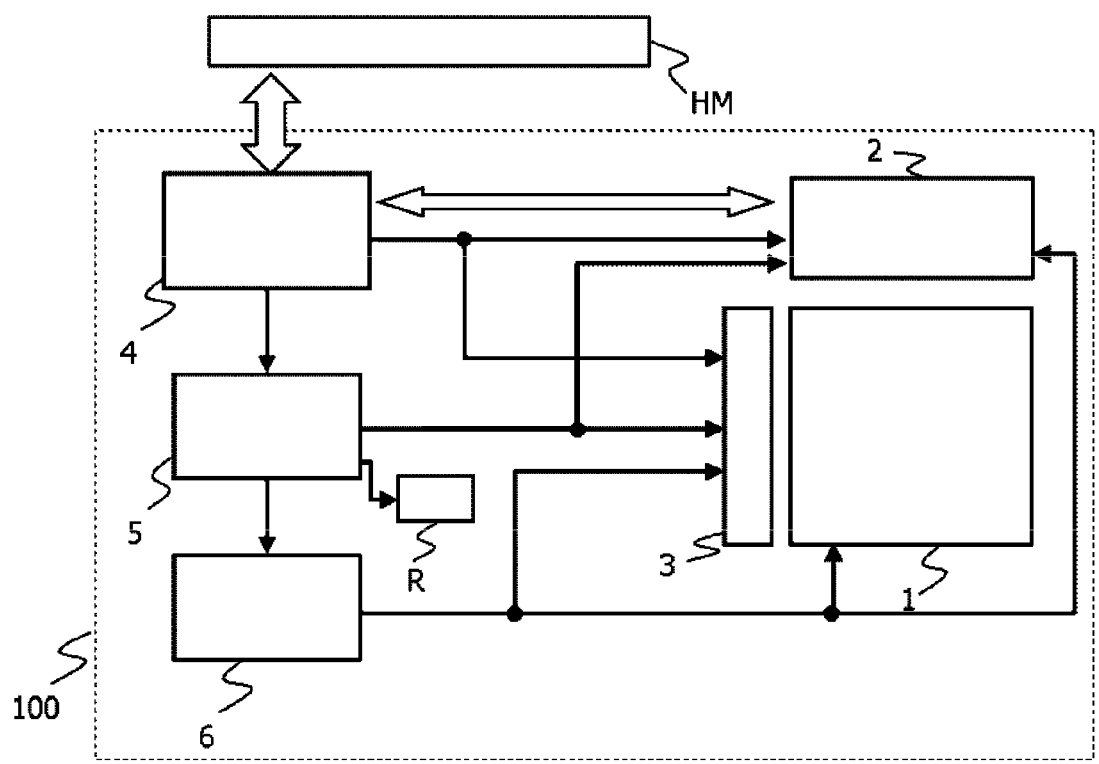
FIG. 1 depicts a NAND-type non-volatile semiconductor memory device.

In general, according to embodiments, a semiconductor device includes a first transistor having a first end (e.g., source/drain terminal) connected to an internal voltage terminal and a second end (e.g., drain/source terminal) connected to a first node that is connected to a first resistance unit. The first resistance unit includes a first resistor connected between the first node and a node providing a monitoring voltage (a monitor node) used for controlling the first transistor. A first resistance adjustment unit of the first resistance unit is connected in parallel with the first resistor. The first resistance adjustment unit includes at least a second resistor and a first switch connected in series.

Connected to the first resistance unit is a second resistance unit including a third resistor connected between the monitor node and a second node, and a second resistance adjustment unit connected in parallel with the third resistor. The second resistance adjustment unit includes at least a fourth resistor and a second switch connected in series. Also included is a first comparator having an output terminal connected to a gate electrode of the first transistor and configured to compare the voltage of the monitor node to a reference voltage and output a control line voltage according to the comparison. Furthermore, a resistance control circuit configured to control a conductance of the first switch and a conductance of the second switch on the basis of an operation initiation signal is included.

Hereinafter, an exemplary embodiment will be described with reference to the drawings.

Firstly, a semiconductor memory device that may incorporate various embodiments of the present disclosure will be described using FIG. 1 and FIG. 2.

A NAND-type flash memory 100 is provided with, for example, a memory cell array 1 disposed in a matrix form. The memory cell array 1 is formed by memory cells MC that store data. The memory cell array 1 includes a plurality of bit lines BL, a plurality of word lines WL, a common source line CELSRC and a plurality of memory cells MC. Each memory cell MC can store n bits (n is an integer of one or more) of data.

A bit line control circuit 2 for controlling a voltage of the bit lines BL and a word line control circuit 3 for controlling a voltage of the word lines WL are connected to the memory cell array 1.

Various commands CMD, addresses ADD, and data DT, used to control the operations of the NAND-type flash memory 100 are supplied from a host or a memory controller HM (there are also cases in which this component is referred to as the "outside," as in, "Commands CMD are supplied from 'outside' of NAND-type flash memory 100."). The various commands CMD, addresses ADD, and data DT are input to a buffer 4. Write data that is input to the buffer 4 is supplied through data input-output lines to bit lines BL that are selected by the bit line control circuit 2. In addition, various commands CMD are input to a control circuit 5 through a command register or the like. In addition, the addresses ADD are input to the bit line control circuit 2 and the word line control circuit 3 through an address register or the like. The control circuit 5, the bit line control circuit 2, and the word line control circuit 3 control a voltage generation circuit 6 on the basis of the commands CMD and the addresses ADD, and execute various operations (e.g., reading and writing) on the memory cells MC. A charge pump circuit, a step-up circuit, a step-down circuit are included in the voltage generation circuit 6.

By the control of the control circuit 5, the voltage generation circuit 6 generates voltages that are necessary for writing, reading, and deletion, and supplies these voltages to the bit line control circuit 2, the word line control circuit 3 and the like. The bit line control circuit 2 and the word line control circuit 3 read data from the memory cells MC, write data to the memory cells MC and delete the data of the memory cells MC using these generated voltages.

The bit line control circuit 2, the word line control circuit 3 and the control circuit 5 are herein referred to collectively as the "control circuits."

Figure 2:
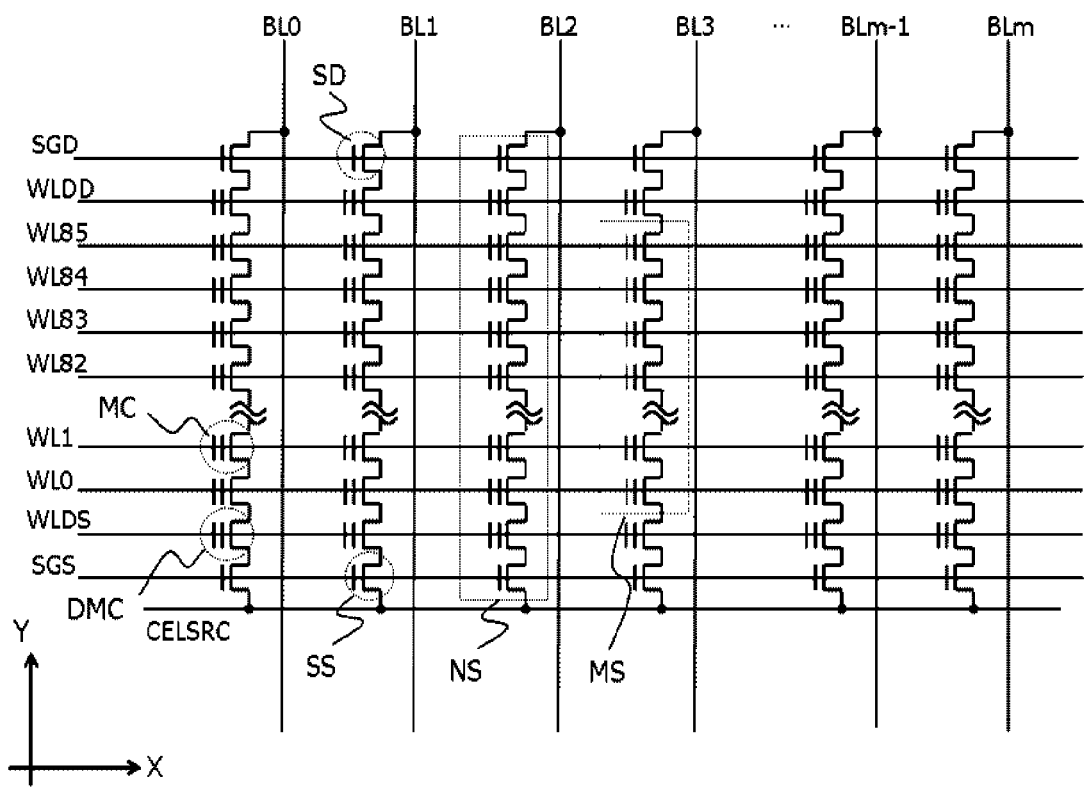
FIG. 2 is a circuit diagram of a memory cell array of a NAND-type non-volatile semiconductor memory device.

FIG. 2 shows an example of a circuit configuration of the memory cell array 1 shown in FIG. 1. A plurality of memory cells MC are disposed in the memory cell array 1. A single NAND string NS comprises, for example, memory strings MS and selection transistors SD and SS which are formed from 86 memory cells MC that are connected in series in a direction of the bit lines (a Y direction in FIG. 2). Additionally, dummy memory cells DMC may be disposed between the memory strings MS and the selection transistor SD and between the memory strings MS and the selection transistor SS.

A plurality (m+1 in the example of FIG. 2) of the NAND strings NS are disposed in a direction of the word lines (an X direction in FIG. 2), one of the bit lines among the plurality of bit lines BL is connected to a first end of the NAND strings NS, and the common source line CELSRC is connected to a second end thereof. Additionally, it could also be said that a plurality of the NAND strings NS are disposed in the direction of the word lines, one of the bit lines among the plurality of bit lines BL is connected to a first end of the NAND strings NS, and the common source line CELSRC is connected to a second end thereof. Control lines (gate electrodes) of the selection transistors SD and SS are respectively connected to selection gates SGD and SGS.

The word lines WL extend in the direction of the word lines and connect the memory cells MC that are aligned in the direction of the word lines. A single page includes memory cells MC that are connected in the direction of the word lines. In this case, a single page can for example, arbitrarily determined as, for example, 16 kbit, 8 kbit or the like. In addition, a block includes NAND strings NS that are lined up in the direction of the word lines. Deletion data in the memory cells MC is performed in block units.

(First Embodiment)

Figure 3:
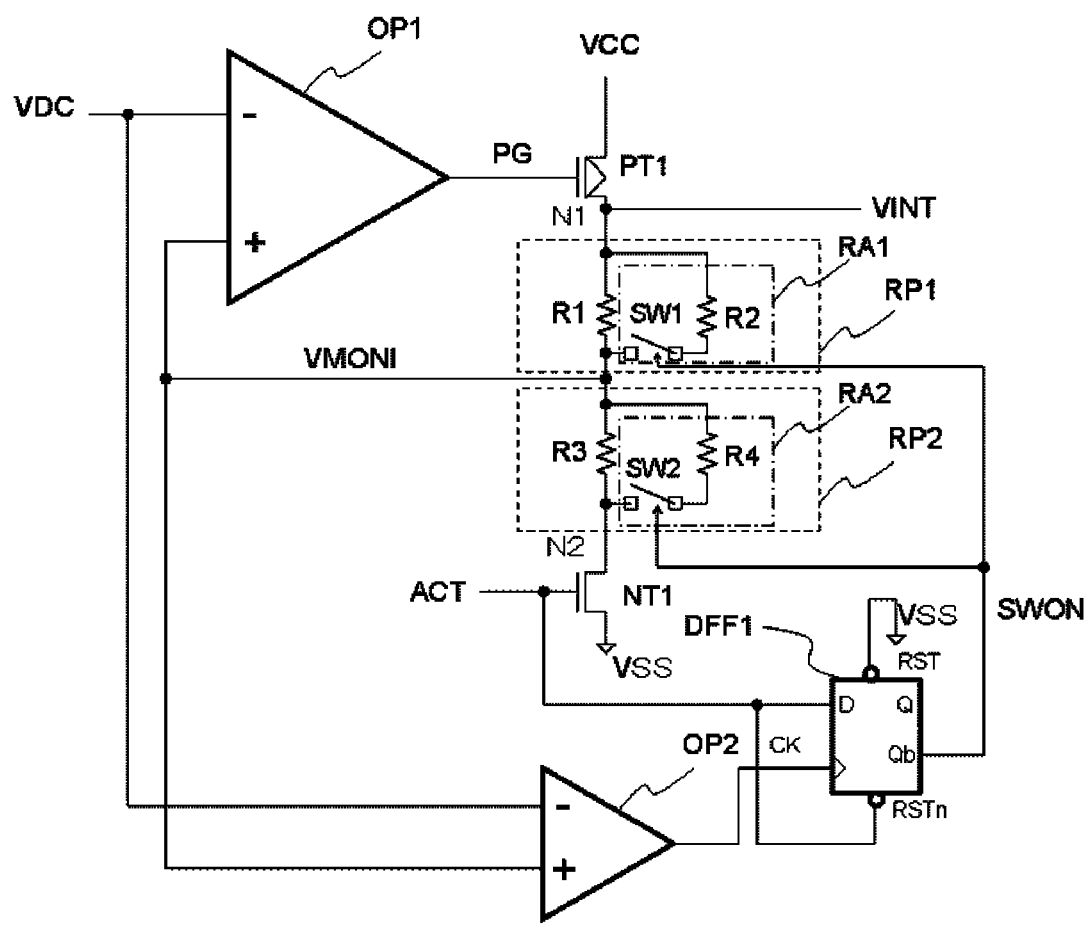
FIG. 3 is a circuit diagram of a step-down circuit according to a first embodiment.

A circuit diagram of a step-down circuit according to the first embodiment is shown in FIG. 3. The step-down circuit that is shown in FIG. 3 is a circuit that generates an internal power-supply voltage VINT by stepping an internal voltage VCC down. The step-down circuit according to the first embodiment includes a p-type first transistor PT1, a first resistance unit RP1, a second resistance unit RP2, an n-type second transistor NT1, a first comparator OP1, a second comparator OP2 and a resistance control circuit DFF1.

A first end of the first transistor PT1 is connected to the internal voltage VCC, and a second end thereof is connected to a first node N1. In this case, a voltage of the node N1 is output as the internal power-supply voltage VINT.

The first resistance unit RP1, the second resistance unit RP2 and the second transistor NT1 are connected in series between the node N1 and a ground voltage VSS. The first resistance unit RP1 is connected to the first node N1 and a node VMONI. The second resistance unit RP2 is connected to the node VMONI and a node N2. A first end of the second transistor NT1 is connected to the node N2, and a second end thereof is connected to the ground voltage VSS. It is possible to input an operation initiation signal ACT to a gate electrode (control line) of the second transistor NT1. Additionally, it is possible to send the operation initiation signal ACT from the control circuit 5.

A reference voltage VDC and the node VMONI are connected to an input of the first comparator OP1. An output of the first comparator OP1 is connected to a gate electrode PG (control line) of the first transistor PT1. The first comparator OP1 compares the reference voltage VDC and the node VMONI, and outputs the result to the gate electrode PG of the first transistor PT1.

The first resistance unit RP1 includes a first resistor R1 and a first resistance adjustment unit RA1 that is connected in parallel with the first resistor R1, and to which a second resistor R2 and a first switching circuit SW1 are connected in series. In addition, the second resistance unit RP2 includes a third resistor R3 and a second resistance adjustment unit RA2 that is connected in parallel with the third resistor R3, and to which a fourth resistor R4 and a second switching circuit SW2 are connected in series. In this case, the first switching circuit SW1 and the second switching circuit SW2 may use n-type transistors, transfer gates or the like.

Additionally, it is possible to dispose the first switching circuit SW1 on a side of the node N1 with respect to the second resistor R2. In addition, it is possible to dispose the second switching circuit SW2 on a side of the node VMONI with respect to the fourth resistor R4.

In this case, it is possible to set such that a ratio of the resistance values of the first resistor R1 and the second resistor R2 is the same ratio as a ratio of the resistance values of the third resistor R3 and the fourth resistor R4. For example, if the resistance value of the second resistor R2 with respect to the resistance value of the first resistor R1 is set as one tenth, in the same manner, the resistance value of the fourth resistor R4 with respect to the third resistor R3 is also set as one tenth. In addition, it is preferable that the resistance value of the second resistor R2 be lower than the resistance value of the first resistor R1. In addition, it is preferable that the resistance value of the fourth resistor R4 be lower than the resistance value of the third resistor R3. As a result, it is possible to improve a response speed of the node VMONI.

The reference voltage VDC and the node VMONI are connected to an input of the second comparator OP2. An output of the second comparator OP2 is connected to the resistance control circuit DFF1. The second comparator OP2 compares the reference voltage VDC and the voltage of the node VMONI, and outputs the result to the resistance control circuit DFF1.

It is possible to input the output of the second comparator OP2 and the operation initiation signal ACT into the resistance control circuit DFF1. In addition, it is possible to connect a reset input RST to the ground voltage VSS. In addition, it is possible to input the operation initiation signal ACT to a reset input RSTn.

The resistance control circuit DFF1 can control on and off switching of the first switching circuit SW1 and the second switching circuit SW2 on the basis of the output of the second comparator OP2 and the operation initiation signal ACT. For example, the resistance control circuit DFF1 outputs a switching control signal from an output Q on the basis of the output of the second comparator OP2 and the operation initiation signal ACT.

The resistance control circuit DFF1 also outputs a reverse switching control signal, which is a reverse signal of the switching control signal to a node SWON through an output Qb. When the voltage is high this is referred to as an "H" level, and when the voltage is low this is referred to as an "L" level. For example, considering a case in which the first and second switching circuits SW1 and SW2 are n-type transistors and the node SWON is connected to the gate electrodes PG of these transistors, when a switching reverse signal is at an "H" level, the n-type transistors (the first switching circuit SW1 and the second switching circuit SW2) are turned on, and when the switching reverse signal is at an "L" level, the n-type transistors (the first switching circuit SW1 and the second switching circuit SW2) are turned off.

Figure 4:
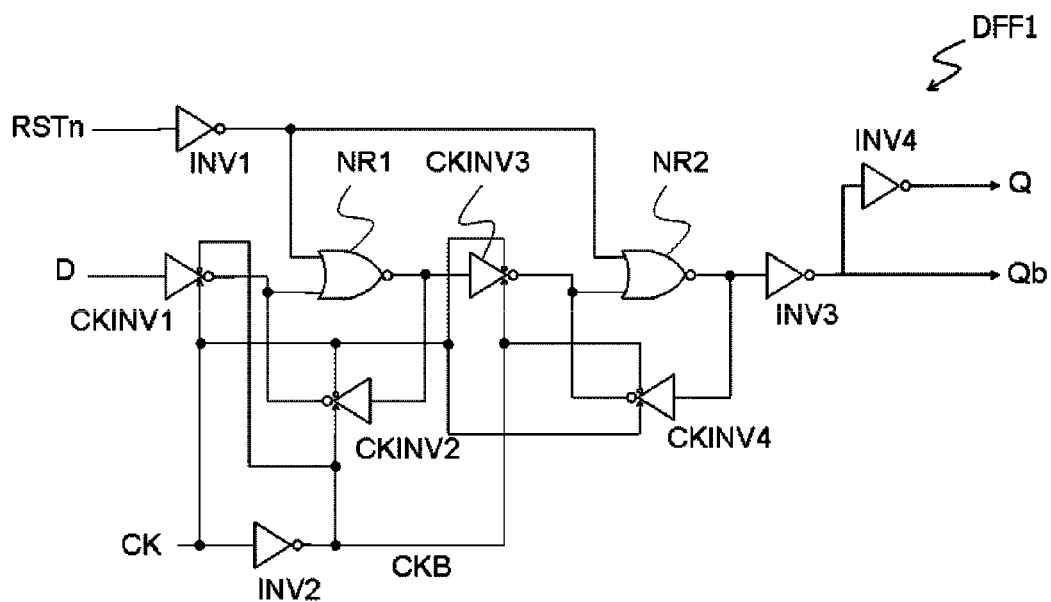
FIG. 4 is a circuit diagram of a resistance control circuit.

A case in which a D-type flip-flop circuit is used is described as an example of the resistance control circuit DFF1 in FIG. 4. The D-type flip-flop circuit (resistance control circuit DFF1) includes four inverter circuits INV1 to 4, four clocked inverter circuits CKINV1 to 4, and two NOR circuits NR1 and NR2.

The output of the second comparator OP2 is input to an input CK. The operation initiation signal ACT is input to an input D and a reset input RSTn. The reset input RSTn is connected to an input of the inverter INV1. The input D is connected to an input of the clocked inverter circuit CKINV1. The input CK is used as a clock signal of the clocked inverter circuits CKINV1 to 4. The input CK is connected to an input of the inverter INV2, and generates a reverse signal of the signal that has been input to the input CK. Additionally, the resistance control circuit DFF1 that is included in this example is a circuit that only uses the reset input RSTn and does not use the reset input RST. Naturally, it is also possible to use a resistance control circuit that uses the reset input RST.

In this case, when the internal power-supply voltage VINT is stable, a width of a voltage amplitude of an output voltage that the first comparator OP1 outputs to the gate electrode PG of the first transistor PT1 is small. Accordingly, it is possible to increase the width of the voltage amplitude of a signal that is input to the input CK of the resistance control circuit DFF1 using the second comparator OP2. As a result of this, it is possible to easily perform adjustment a threshold voltage of transistors that the clocked inverter circuit CKINV1 and the inverter circuit INV2.

A signal of the input CK and a reverse signal of the input CK are input to clock signals of the clocked inverter circuits CKINV1 to 4. In this case, the clocked inverter circuits CKINV1 and 4 attain a state in which input is possible when the signal of the input CR is at an "H" level and function as inverter circuits. On the other hand, the clocked inverter circuits CKINV1 and 4 attain a high impedance state when the signal of the input CK is at an "L" level and retain a level that has been output. In addition, the clocked inverter circuits CKINV2 and 3 attain a state in which input is possible when the signal of the input CR is at an "L" level and function as inverter circuits. On the other hand, the clocked inverter circuits CKINV2 and 3 attain a high impedance state when the signal of the input CR is at an "H" level and retain a level that has been output using a latch that includes the clocked inverter circuit CKINV4 and the NOR circuit NR2.

An output of the inverter INV1 is connected to a first input of both of the NOR circuits NR1 and NR2. An output of the clocked inverter circuit CKINV1 is connected to a second input of the NOR circuit NR1. An output of the NOR circuit NR1 is connected to an input of the clocked inverter circuit CKINV3. In this case, the NOR circuit NR1 acquires a signal that is input to the reset input RSTn and a NOR of a reverse signal that is input to the input D, and outputs these signals to the clocked inverter circuit CKINV3.

An output of the clocked inverter circuit CKINV3 is connected to a second input of the NOR circuit NR2. An output of the NOR circuit NR2 is connected to an input of the inverter circuit INV3. In this case, the NOR circuit NR2 acquires a signal that is input to the reset input RSTn and a NOR of a reverse signal of the output of the NOR circuit NR2, and outputs these signals to the inverter circuit INV3.

An output of the inverter circuit INV3 is connected to an input and an output Qb of the inverter circuit INV4. The input of the inverter circuit INV4 is connected to the output Q. In this case, the output of the inverter circuit INV3 is output to the output Qb, and a reverse signal of the output of the inverter circuit INV3 is output to the output Q.

Additionally, the output of the NOR circuit NR2 is also connected to the input of the clocked inverter circuit CKINV4. An output of the clocked inverter circuit CKINV4 is connected to the second input of the NOR circuit NR2. In this case, the clocked inverter circuit CKINV4 configures a data latch circuit with the NOR circuit NR2, and has a function of retaining the input level of the second input of the NOR circuit NR2.

Figure 5:
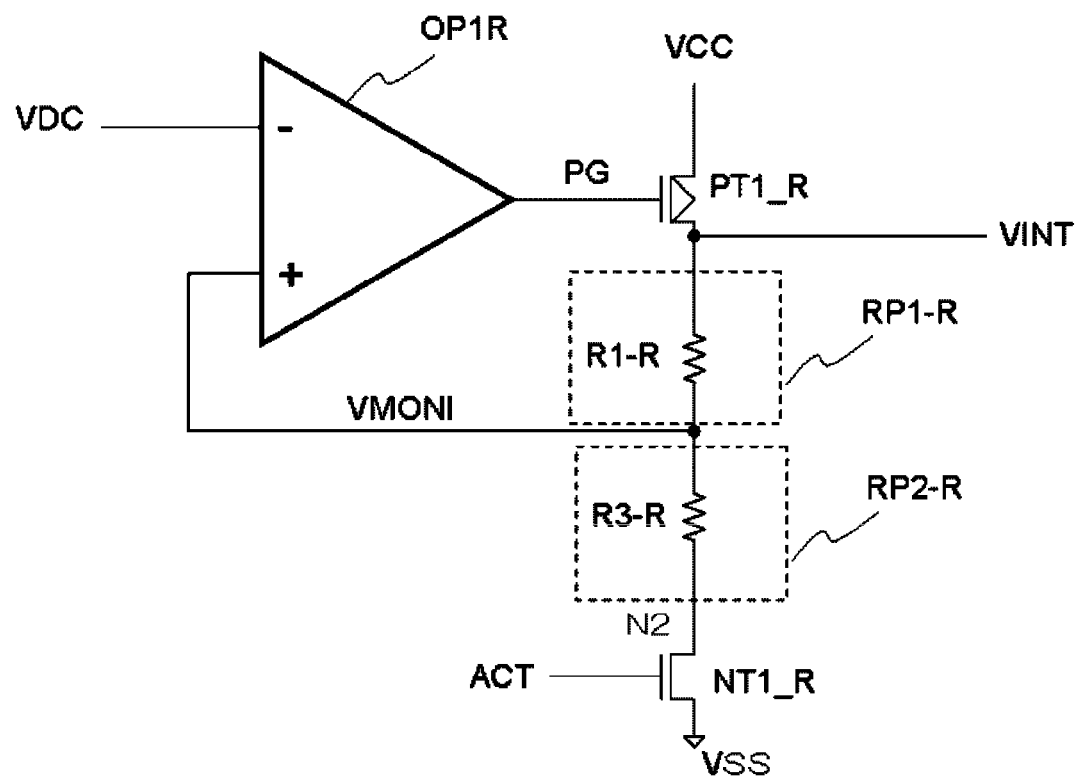
FIG. 5 is a circuit diagram of a comparative example of a step-down circuit.

An example of a comparative example of a step-down circuit according to the first embodiment is shown in FIG. 5. The second comparator OP2 and the resistance control circuit DFF1 are not included in the comparative example. In addition, a first resistance unit RP1-R and a second resistance unit RP2-R only respectively includes a first resistor R1-R and a third resistor R3-R. In this case, a resistance value of the first resistor R1-R is the same as a resistance value of the first resistor R1, and a resistance value of the third resistor R3-R is the same as a resistance value of the third resistor R3. Description of the rest of the configuration is omitted since the configuration is the same as the step-down circuit according to the first embodiment.

Figure 6:
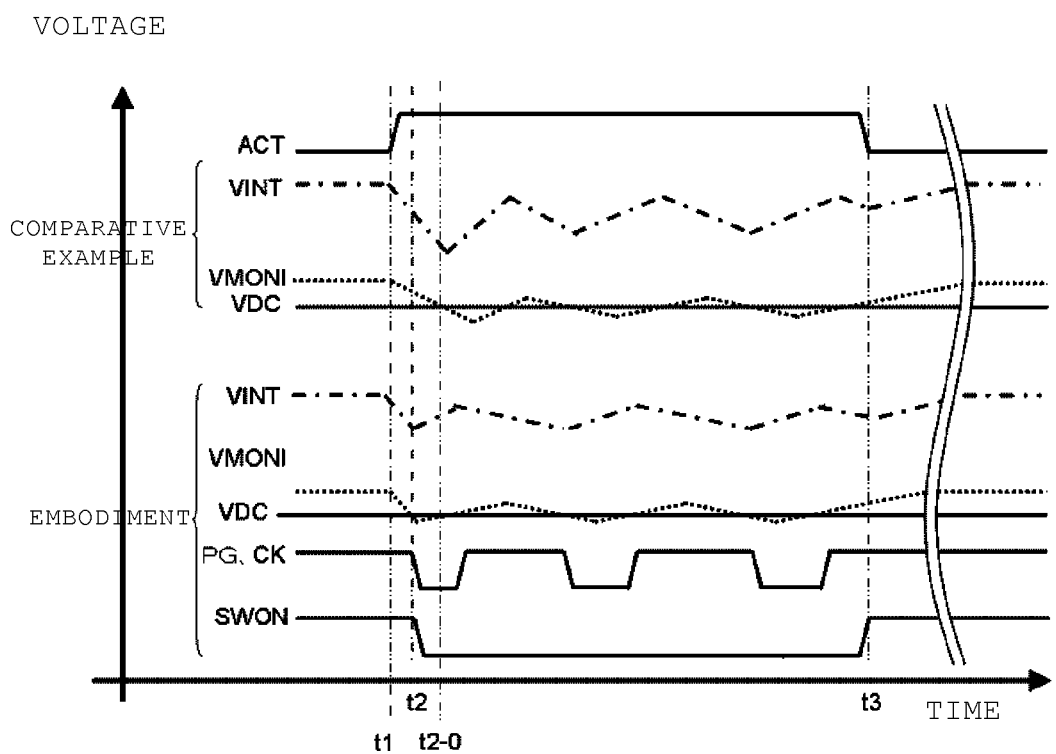
FIG. 6 depicts a voltage waveform of the step-down circuit according to the first embodiment.

An example of a voltage waveform of the step-down circuit according to the first embodiment is shown in FIG. 6. In addition, an example of a voltage waveform of the comparative example is also shown in FIG. 6.

Firstly, in the step-down circuit according to the first embodiment, an "L" level is input to the reset input RSTn when the operation initiation signal ACT is at an "L" level. That is, the output of the NOR circuit NR2 that is disposed in the resistance control circuit DFF1 is fixed at an "L" level. As a result of this, an output signal that is output from the output Qb becomes an "H" level, and the node SWON becomes an "H" level. Therefore, first and second switches SW1 and SW2 are both turned on.

Next, the operation initiation signal ACT becomes an "H" level at a time t1. As a result of this, the second transistor NT1 attains a conductive state and the step-down circuit initiates operation. A voltage of the internal power-supply voltage VINT falls from the time t1. In addition, a voltage of the node VMONI falls so as to follow the internal power-supply voltage VINT.

In addition, as a result of the operation initiation signal ACT attaining an "H" level, an "H" level is input to the reset input RSTn of the resistance control circuit DFF1. That is, the NOR circuit NR2 operates as an inverter circuit. However, the input CK is at an "H" level at the time of the time t1. Therefore, the clocked inverter circuit CKINV3 is in a high impedance state. As a result of this, the output signal that is output from the output Qb remains at an "H" level.

In this case, a resistance value of the first resistor R1 is referred to as RR1 and a resistance value of the second resistor R2 is referred to as RR2. Accordingly, a resistance value of the resistance unit RP1 becomes RR1×RR2/(RR1+RR2). Consequently, the resistance value of the first resistance unit RP1 is smaller than the resistance value RR1 of the first resistor R1. In the same manner, a resistance value of the third resistor R3 is referred to as RR3 and a resistance value of the fourth resistor R4 is referred to as RR4. Accordingly, a resistance value of the resistance unit RP2 becomes RR3×RR4/(RR3+RR4). Consequently, the resistance value of the second resistance unit RP2 is smaller than the resistance value RR3 of the third resistor R3.

As a result of this, the voltage of the node VMONI decreases rapidly and reaches a value that is the same as that of the reference voltage VDC at a time t2. On the other hand, in the comparative example, the resistance value of the first resistance unit RP1-R remains as RR1. The resistance value of the second resistance unit RP2-R remains as RR3 in the same manner. Accordingly, the decrease in the voltage of the node VMONI is slow, and reaches a value that is the same as that of the reference voltage VDC at a time t2-0 which is later than the time t2. In the description of the embodiment, there are cases in which the period from time t1 to time t2 is referred to as an "initial step-down period", and the fall in the voltage of the node VMONI in the initial step-down period is referred to as the "initial step-down".

Next, when the voltage of the node VMONI becomes the same value as the reference voltage VDC at the time t2, the output of the second comparator OP2 changes from an "H" level to an "L" level. As a result of this, the clocked inverter circuit CKINV3 attains a state in which input is possible. In this case, the output of the NOR circuit NR1 becomes an "H" level. Accordingly, as a result of the "H" level that is the output of the NOR circuit NR1 passing through the clocked inverter circuit CKINV3, the NOR circuit NR2 and the inverter circuit INV3, the output signal that is output from the output Qb becomes an "L" level.

As a result of this, the node SWON attains an "L" level, and the first and second switching circuits SW1 and SW2 are turned off. Accordingly, a normal resistance state (a resistance value that is the same as the resistance value of the comparative example) in which the first resistance unit RP1 only includes the first resistor R1 is attained. In the same manner, a normal resistance state in which the second resistance unit RP2 is only includes the third resistor R3 is attained.

Thereafter, the resistance control circuit DFF1 outputs an "L" level from the output Qb regardless of the level of the input CK to the node SWON. As a result of this, the first resistance unit RP1 and the second resistance unit RP2 remain in the normal resistance state, and the value of the internal power-supply voltage VINT is adjusted by outputting the compared result of the node VMONI and the reference voltage VDC by the first comparator OP1 to the gate electrode PG (control line) of the first transistor PT1. That is, it is possible to perform the same operation as that of the comparative example from the time t2 onwards. In this case, it can be said that the resistance control circuit DFF1 controls the first switching circuit SW1 and the second switching circuit SW2 on the basis of the operation initiation signal ACT.

Thereafter, a signal that stops the operation of the step-down circuit is sent from the control circuit 5 at a time t3. For example, the control circuit 5 sets the operation initiation signal ACT to an "L" level. As a result of this, the second transistor NT1 attains a non-conductive state and the step-down circuit stops operating. As a result of this, the voltage of the node VMONI rises. In addition, an "L" level is input to the reset input RSTn of the resistance control circuit DFF1. In this case, the output of the NOR circuit NR2 is fixed at an "L" level. As a result of this, the output signal that is output from the output Qb becomes an "H" level. That is, the node SWON becomes an "H" level. Additionally, the outputs of the comparators OP1 and OP2 attain "H" levels. Accordingly, an "H" level is input to the gate electrode PG of a first transistor TP1. As a result of this, the first transistor TP1 is turned off. In addition, an "H" level is input to the input CK of the resistance control circuit DFF1.

In the step-down circuit according to the first embodiment, a voltage difference of the node VMONI and the reference voltage VDC is large in the initial step-down, and it is preferable that a discharge speed of the node VMONI be increased. In this case, by causing the first and second resistance units RP1 and RP2 to attain low resistance states in the initial step-down period, the discharge speed of the node VMONI is increased and thereafter, discharge from the node VMONI proceeds and when the voltage of the node VMONI and the reference voltage VDC become the same, the resistance control circuit DFF1 turns the first and second switching circuits SW1 and SW2 off and returns the first and second resistance units RP1 and RP2 to the normal resistance states.

That is, in the step-down circuit according to the first embodiment, from the operation initiation signal ACT and the node VMONI when the initial step-down period has been completed, it is possible to autonomously change the first and second resistance units RP1 and RP2 from the low resistance states to the normal resistance states. On the other hand, in the comparative example, it is not possible to put the first and second resistance units RP1 and RP2 into the low resistance states during a period of time that is immediately after the initiation of step-down. As a result of this, the discharge speed of the node VMONI is slow, and the node VMONI and the reference voltage VDC become the same at a time t2-0 which is later than the time t2.

In this case, it is determined whether the internal power-supply voltage VINT reached a set voltage at the time when the node VMONI became the same as the reference voltage VDC. That is, in the comparative example, the internal power-supply voltage VINT continues to fall until the time t2-0. This means that, in the comparative example, since the resistances of the first and second resistance units RP1 and RP2 is high in the initial step-down, the following of the potential of the node VMONI with respect to the internal power-supply voltage VINT is slowed. On the other hand, in the step-down circuit according to the first embodiment, since the resistances of the first and second resistance units RP1 and RP2 are lower than those of the comparative example in the initial step-down, the following of the potential of the node VMONI with respect to the internal power-supply voltage VINT is faster. As a result of this, in the step-down circuit according to the first embodiment, it is possible to prevent the voltage of the internal power-supply voltage VINT from becoming low in the initial step-down.

Furthermore, in addition to improving the step-down speed in the initial step-down, the step-down circuit according to the first embodiment can return the first and second resistance units RP1 and RP2 to the normal resistance states after the internal power-supply voltage VINT has reached a set value. As a result of this, after the initial step-down period, it is possible to reduce a discharge and charge current that flows through the first transistor PT1, the first resistance unit RP1, the second resistance unit RP2 and the second transistor NT1 from the internal voltage VCC.

In addition, it is possible to have a resistance ratio of the first resistance unit RP1 and the second resistance unit RP2 be the same in the normal resistance states as in the low resistance states by setting the ratio of the resistance values of the first resistor R1 and the second resistor R2 and the ratio of the resistance values of the third resistor R3 and the fourth resistor R4 to be the same ratio. As a result of this, it is possible to configure target values of the internal power-supply voltage VINT and the node VMONI as the same in the low resistance states and the normal resistance states of the first and second resistance units RP1 and RP2, and it is possible to simplify the circuit configuration.

(Second Embodiment)

Figure 7:
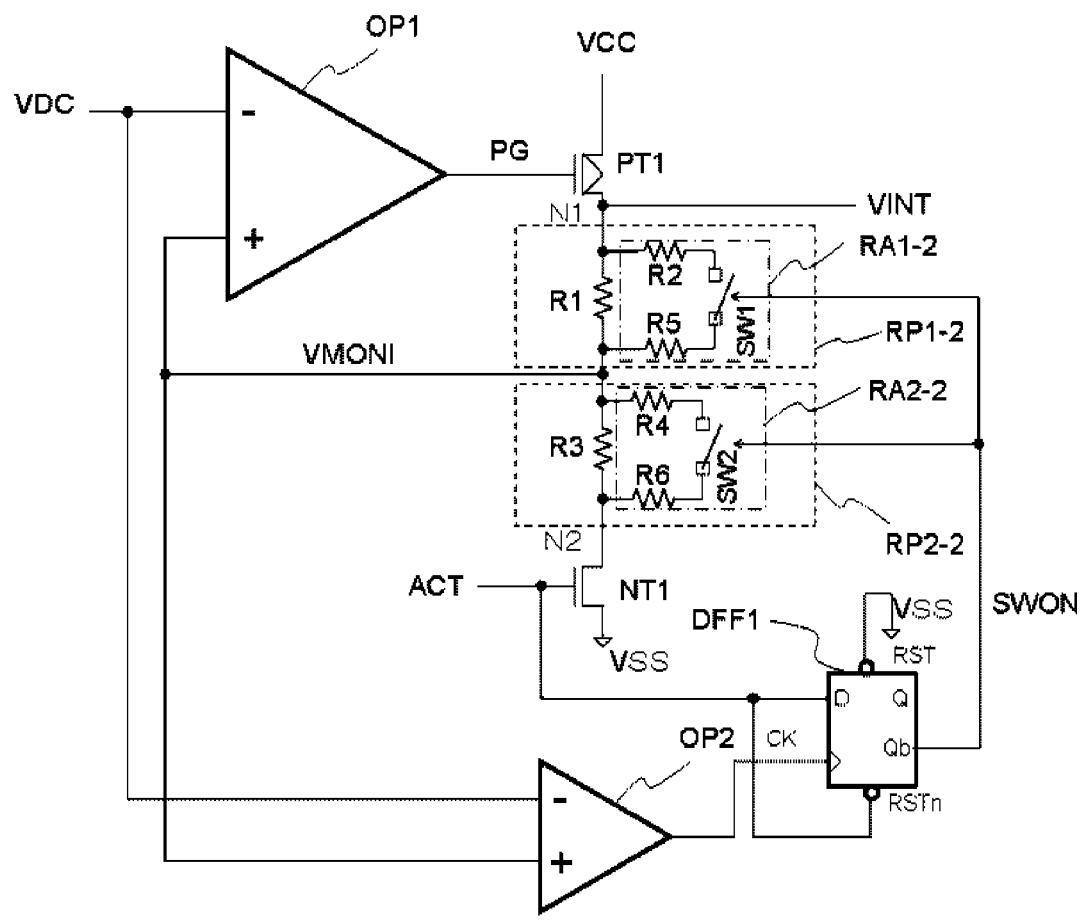
FIG. 7 is a circuit diagram of a step-down circuit according to a second embodiment.

An example of a circuit diagram of a step-down circuit according to a second embodiment is shown in FIG. 7. In the second embodiment, the configurations of the first and second resistance units differ from those of the first embodiment.

As shown in FIG. 7, a first resistance unit RP1-2 includes a first resistor R1 and a first resistance adjustment unit RA1-2 that is connected in parallel with the first resistor R1. In the first resistance adjustment unit RA1-2, a second resistor R2, a first switching circuit SW1 and a fifth resistor R5 are connected in series. In addition, a second resistance unit RP2-2 includes a third resistor R3 and a second resistance adjustment unit RA2-2 that is connected in parallel with the third resistor R3. In the second resistance unit RP2-2 a fourth resistor R4, a second switching circuit SW2 and a sixth resistor R6 are connected in series. Additionally, the first switch SW1 is between the second resistor R2 and the fifth resistor R5, and the second switch SW2 is between the fourth resistor R4 and the sixth resistor R6. In this case, the first switching circuit SW1 and the second switching circuit SW2 may use n-type transistors, transfer gates or the like.

It is possible to set a ratio between the resistance values of the first resistor R1, the second resistor R2 and the fifth resistor R5 to be the same ratio as that between resistance values of the third resistor R3, the fourth resistor R4 and the sixth resistor R6. For example, if a combined resistance values of the second resistor R2 and the fifth resistor R5 is set to be one tenth the resistance value of the first resistor R1, a combined resistance value of the fourth resistor R4 and the sixth resistor R6 can also be set to be one tenth of to the resistance value of the third resistor R3. In general, it is preferable that the combined resistance value of the second resistor R2 and the fifth resistor R5 be lower than the resistance value of the first resistor R1. In addition, it is generally preferable that the combined resistance value of the fourth resistor R4 and the sixth resistor R6 be lower than the resistance value of the third resistor R3. By the use of this relative relationship of resistance values, it is possible to improve the response speed of the node VMONI.

In addition, the number of resistors that are included in the first resistance adjustment unit RA1-2 and the second resistance adjustment unit RA2-2 is not limited to two, and more than two resistors maybe included therein. In addition, provided they are in parallel with the first resistor R1 or the third resistor R3, the specific positioning of the switches SW can be determined freely. That is, the first resistance adjustment unit RA1 and the second resistance adjustment unit RA2 may be respectively disposed in parallel with the first resistor R1 and the third resistor R3, and it is possible to otherwise change the layout thereof freely.

In the second embodiment, it is also possible to obtain the same effects as those of the first embodiment.

In addition, it can be said that the first switch SW1 is connected to the first resistor R1 through the second resistor R2 and the fifth resistor R5. In the same manner, it can be said that the second switch SW2 is connected to the third resistor R3 through the fourth resistor R4 and the sixth resistor R6. Accordingly, it is possible to absorb noise that is produced when the first switch SW1 and the second switch SW2 switch by using the second resistor R2, the fourth resistor R4, the fifth resistor R5 and the sixth resistor R6. Accordingly, it is possible to reduce noise that is transmitted to the first resistor R1 or the third resistor R3. As a result of this, it is possible to further stabilize the step-down operation during the period immediately after the time t2.

(Third Embodiment)

Figure 8:
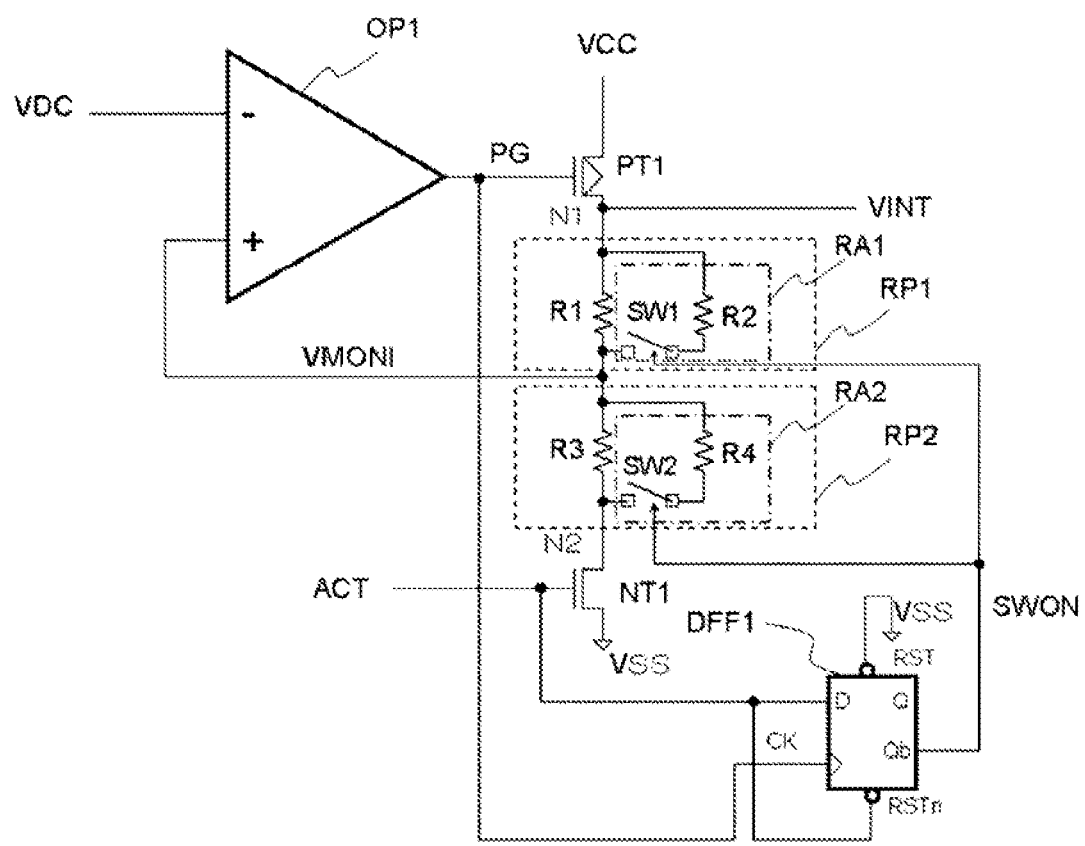
FIG. 8 is a circuit diagram of a step-down circuit according to a third embodiment.

An example of a circuit diagram of a step-down circuit according to a third embodiment is shown in FIG. 8. In the third embodiment, the second comparator is omitted from the configuration of the first embodiment. As shown in FIG. 8, an output of a first comparator OP1 is connected to an input CK of a resistance control circuit DFF1. It is also possible for the resistance control circuit DFF1 to perform control in the same manner as the first embodiment with the step-down circuit having this configuration. As mentioned above, when the internal power-supply voltage VINT is stable, a width of a voltage amplitude of an output voltage that the first comparator OP1 outputs to the gate electrode PG of the first transistor PT1 is small. However, it is possible to use the output voltage of the first comparator OP1 for the input CK of the resistance control circuit DFF1 by adjusting a value of a threshold voltage of transistors in the clocked inverter circuit CKINV1 and the inverter circuit INV2, which receive the signal of the input CK.

In addition, when the width of the voltage amplitude of the output voltage of the first comparator OP1 is relatively large due to a voltage that the step-down circuit outputs and a capacitance value that is connected to the output of the step-down circuit, it is also possible to use the output voltage of the first comparator OP1 for the input CK of the resistance control circuit DFF1.

In the third embodiment, it is also possible to obtain the same effects as those of the first embodiment.

In addition, it is possible to reduce a surface area of the step-down circuit by integrating the first comparator OP1 and the second comparator OP2.

(Fourth Embodiment)

Figure 9:
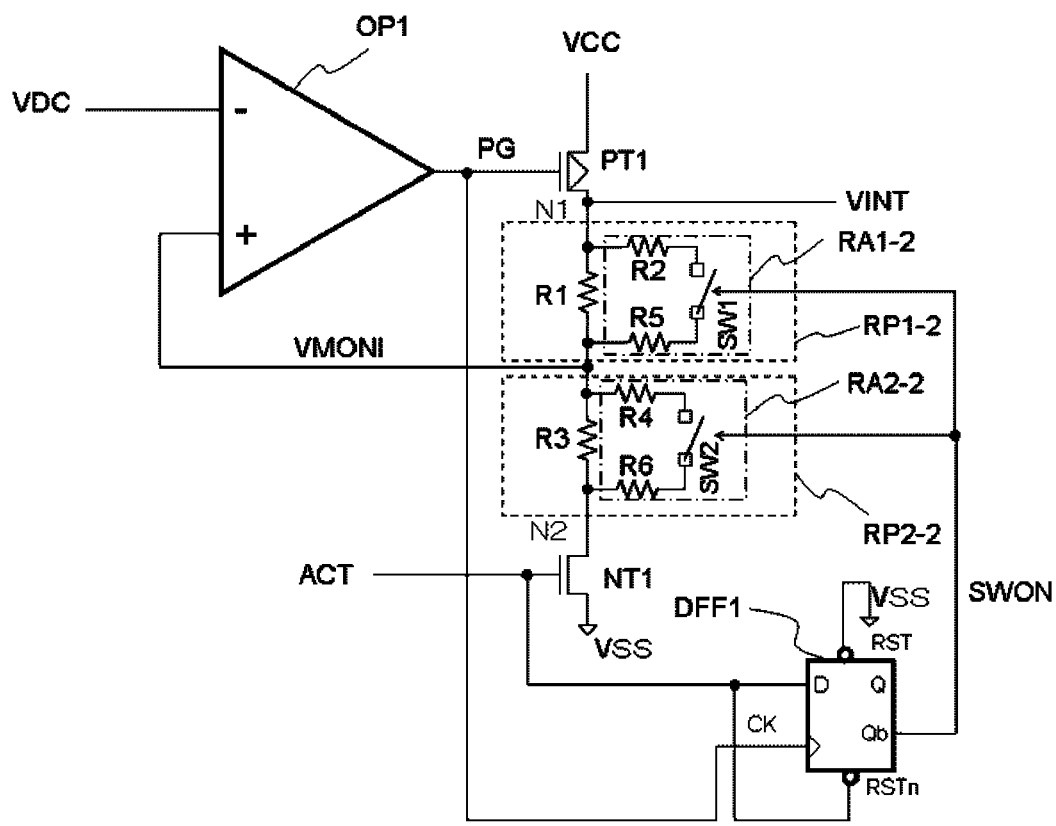
FIG. 9 is a circuit diagram of a step-down circuit according to a fourth embodiment.

An example of a circuit diagram of a step-down circuit according to a fourth embodiment is shown in FIG. 9. In the fourth embodiment, the second embodiment and the third embodiment are combined.

In the fourth embodiment, it is possible to obtain all of the effects of the first to third embodiments.

(Fifth Embodiment)

Figure 10:
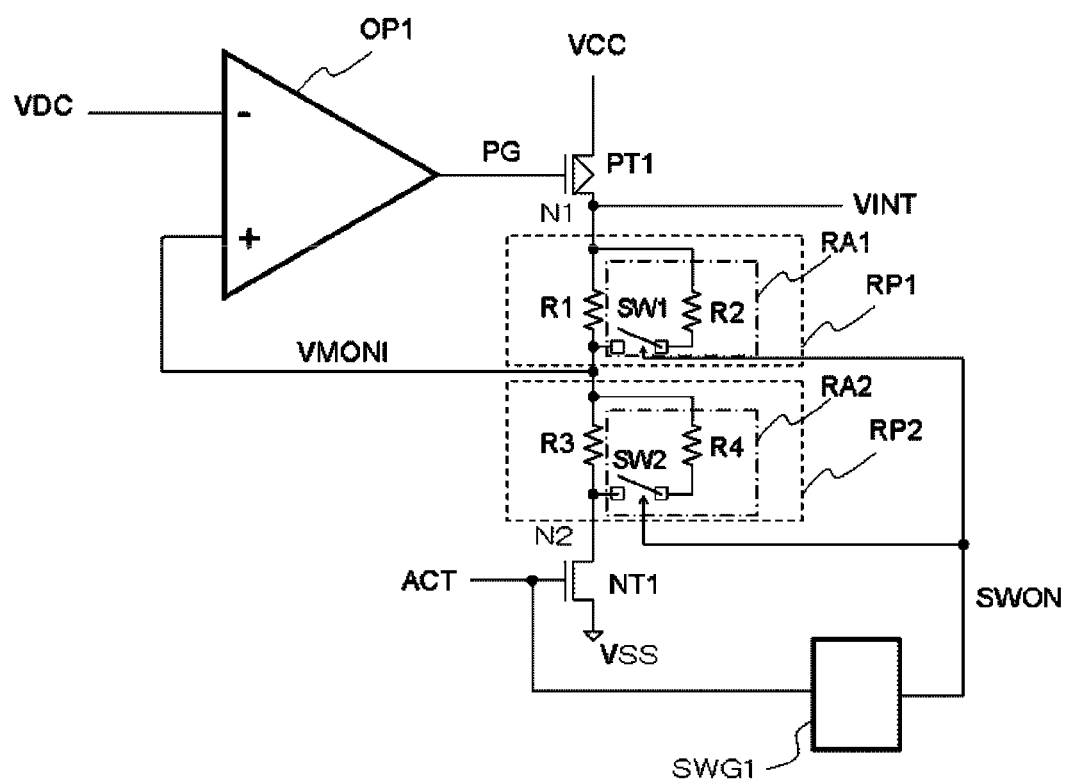
FIG. 10 is a circuit diagram of a step-down circuit according to a fifth embodiment.

An example of a circuit diagram of a step-down circuit according to a fifth embodiment is shown in FIG. 10. In the fifth embodiment, the resistance control circuit from the configuration of the first embodiment is changed.

A resistance control circuit SWG1 is included in the fifth embodiment. The operation initiation signal ACT is connected to an input of the resistance control circuit SWG1, and an output thereof is connected to the node SWON. The resistance control circuit SWG1 can control the on and off switching of the first switching circuit SW1 and the second switching circuit SW2 on the basis of the operation initiation signal ACT.

Figure 11:
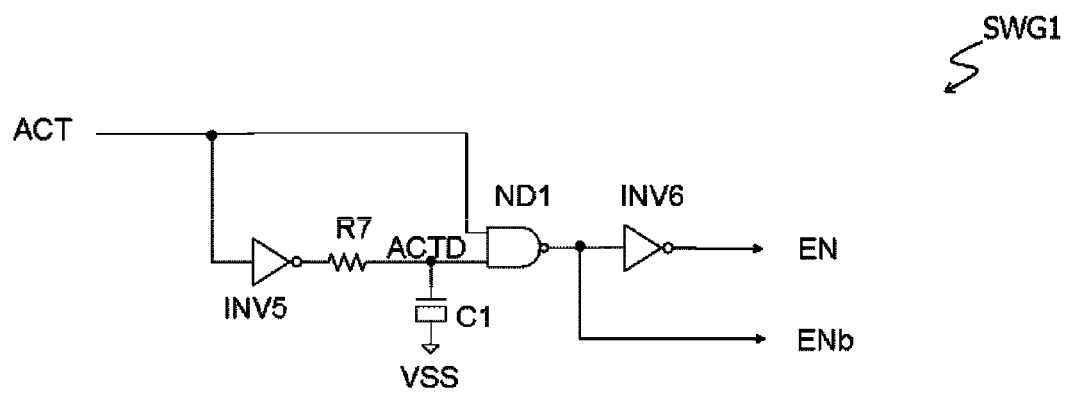
FIG. 11 is a circuit diagram of a resistance control circuit.

An example of a circuit diagram of the resistance control circuit SWG1 is shown in FIG. 11. For example, the resistance control circuit SWG1 is a pulse generation circuit in which a delay circuit is applied. As shown in FIG. 11, the resistance control circuit SWG1 includes two inverter circuits INV5 and 6, one NAND circuit ND1, one resistor R7 and one capacitance element C1.

An operation initiation signal ACT that is input to the resistance control circuit SWG1 is input to the inverter INV5 and a first end of the NAND circuit ND1. An output of the inverter INV5 is connected to a second end of the NAND circuit through the resistor R7. In addition, a first end of the capacitance element C1 is connected to a node ACTD between the resistor R7 and the NAND circuit ND1. A second end of the capacitance element C1 is connected to a ground voltage VSS. An output of the NAND circuit ND1 is connected to an output ENb and an input of the inverter INV6. An output of the inverter INV6 is connected to an output EN. That is, the output of the NAND circuit ND1 is output to the output ENb, and a reverse of the output of the NAND circuit ND1 is output to the output EN. In addition, the output EN is connected to the node SWON.

Figure 12:
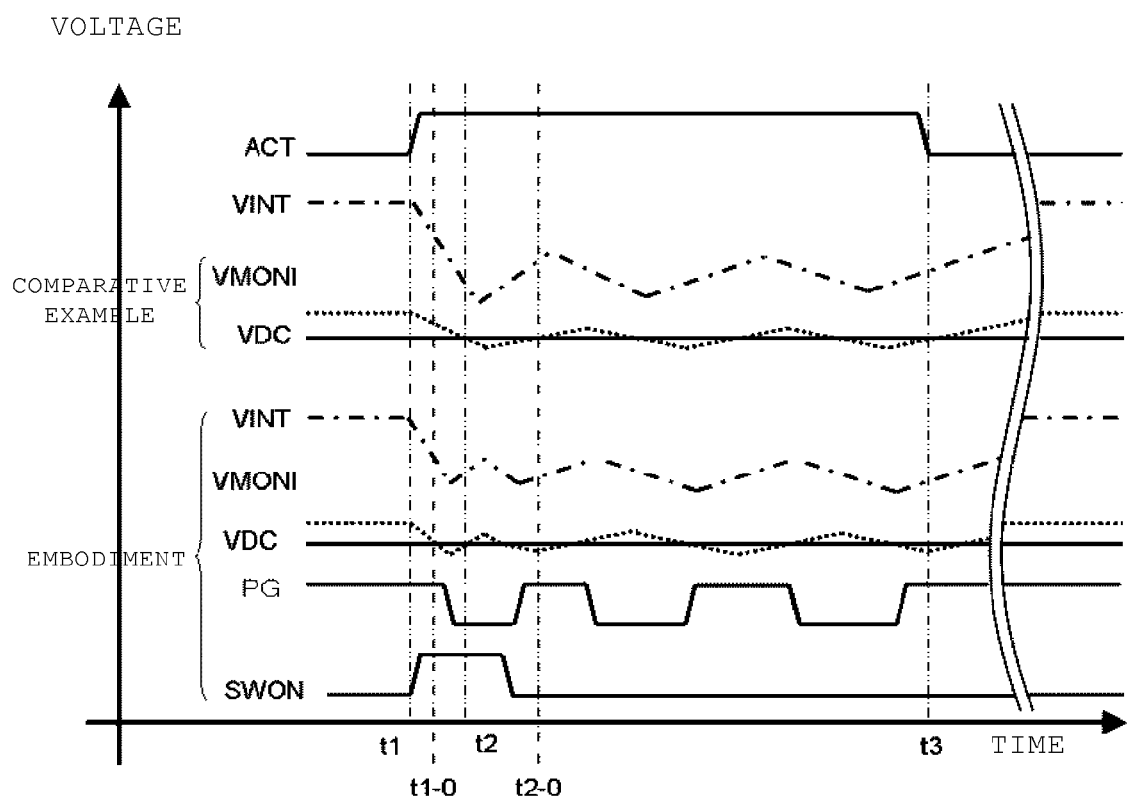
FIG. 12 depicts a voltage waveform of the step-down circuit according to the fifth embodiment.

An example of a voltage waveform of the step-down circuit according to the fifth embodiment is shown in FIG. 12. In addition, an example of a voltage waveform of the comparative example shown in FIG. 5 is also shown.

Firstly, in the step-down circuit according to the fifth embodiment, an "L" level is input to the first end of the NAND circuit ND1 when the operation initiation signal ACT is at an "L" level. At this time, since the node ACTD becomes an "H" level, a signal that is input to the NAND circuit ND1 is at an "L" level and an "H" level. As a result of this, the output of the NAND circuit ND1 becomes an "H" level. Accordingly, an output signal that is output from the output EN becomes an "L" level. As a result of this, the node SWON becomes an "L" level. Therefore, the first and second switches SW1 and SW2 are both turned off.

Next, at a time t1, the operation initiation signal ACT becomes an "H" level. As a result of this, the second transistor NT1 attains a conductive state and the step-down circuit initiates operation. Accordingly, a voltage of the node VMONI falls from the time t1.

In addition, since the capacitance element C1 is charged before the time t1, the node ACID of the resistance control circuit SWG1 retains an "H" level for a fixed period of time. Accordingly, a signal that is input to the NAND circuit ND1 becomes an "H" level and an "H" level, and the output of the NAND circuit ND1 becomes an "L" level. Accordingly, the output signal that is output from the output EN becomes an "H" level. As a result of this, the node SWON becomes an "H" level. Therefore, the first and second switches SW1 and SW2 are both turned on.

In this case, a resistance value of the first resistor R1 is referred to as RR1 and a resistance value of the second resistor R2 is referred to as RR2. Accordingly, a resistance value of the resistance unit RP1 becomes RR1×RR2/(RR1+RR2). Consequently, the resistance value of the first resistance unit RP1 is smaller than the resistance value RR1 of the first resistor R1. In the same manner, a resistance value of the third resistor R3 is referred to as RR3 and a resistance value of the fourth resistor R4 is referred to as RR4. Accordingly, a resistance value of the resistance unit RP2 becomes RR3×RR4/(RR3+RR4). Consequently, the resistance value of the resistance unit RP2 is smaller than the resistance value RR3 of the third resistor R3.

As a result of this, the voltage of the node VMONI decreases rapidly and reaches a value that is the same as that of the reference voltage VDC at a time t1-0. On the other hand, in the comparative example, the resistance value of the first resistance unit RP1-R remains as RR1. The resistance value of the resistance unit RP2-R remains as RR3 in the same manner. Accordingly, the decrease in the voltage of the node VMONI is slow, and reaches a value that is the same as that of the reference voltage VDC at a time t2-0 which is later than the time t1-0. In the description of the present embodiment, there are cases in which the period of time t1 to time t1-0 is referred to as an "initial step-down period", and the fall in the voltage of the node VMONI in the initial step-down period is referred to as the "initial step-down".

Next, the charged capacitance element C1 is discharged from the inverter circuit INV5 and the like through the resistor R7; and the discharge of the capacitance element C1 is completed at the time t2. At this time, the level of the ACTD becomes an "L" level, and a signal that is input to the NAND circuit ND1 becomes an "H" level and an "L" level. Therefore, the output of the NAND circuit ND1 becomes an "H" level. Accordingly, the output signal that is output from the output EN becomes an "L" level. As a result of this, the node SWON becomes an "L" level. Therefore, the first and second switches SW1 and SW2 are both turned off.

In this case, a period between the time t1 and the time t2 is approximately 200 ns. In the time t2, it is possible to regulate the time t2 by changing a resistance value of the resistor R7 and a capacity of the capacitance element C1. In addition, the initial step-down period is completed before the time t2. That is, the initial step-down is completed before the first and second resistance units RP1 and RP2 return to normal resistance states.

Meanwhile, the value of the internal power-supply voltage VINT is adjusted by outputting the compared result of the node VMONI and the reference voltage VDC by the first comparator OP1 to the gate electrode PG (control line) of the first transistor PT1. The adjustment of the internal power-supply voltage VINT by the first comparator OP1 is performed independently of the control of the resistance control circuit SWG1.

Accordingly, the first comparator OP1 performs adjustment of the internal power-supply voltage VINT with the first and second resistance units RP1 and RP2 in low resistance states in a period between the time t1 and the time t2, and performs adjustment of the internal power-supply voltage VINT with the first and second resistance units RP1 and RP2 in normal resistance states from the time t2 onwards. That is, the step-down circuit according to the fifth embodiment can perform the same operation as that of the comparative example from the time t2 onwards. In this case, it can be said that the resistance control circuit SWG1 controls the first switching circuit SW1 and the second switching circuit SW2 on the basis of the operation initiation signal ACT.

Thereafter, a signal that stops the operation of the step-down circuit is sent from the control circuit 5 at a time t3. For example, the control circuit 5 sets the operation initiation signal ACT to an "L" level. As a result of this, the second transistor NT1 attains a non-conductive state and the step-down circuit stops operating. Accordingly, the voltage of the node VMONI rises. In addition, an "L" level is input to resistance control circuit SWG1. That is, since an "L" level is input to the first input of the NAND circuit ND1, the output of the NAND circuit ND1 becomes an "L" level. As a result of this, the output signal that is output from the output EN becomes an "L" level. That is, the node SWON becomes an "L" level. Additionally, the output of the comparator OP1 becomes an "H" level. Accordingly, an "H" level is input to the gate electrode PG of the first transistor TP1. As a result of this, the first transistor TP1 is turned off.

Additionally, the node ACTD becomes an "H" level from the time t3 onwards, and charging of the capacitance element C1 is performed.

In summary, in the step-down circuit according to the fifth embodiment, a voltage difference of the node VMONI and the reference voltage VDC is large in the initial step-down, and it is preferable that a discharge speed of the node VMONI be increased. In this case, as a result of causing the first and second resistance units RP1 and RP2 to attain low resistance states immediately after the time t1, the discharge speed of the node VMONI is increased.

Thereafter, after a fixed period of time has passed, the resistance control circuit SWG1 turns the first and second switching circuits SW1 and SW2 off, and returns the first and second resistance units RP1 and RP2 to the normal resistance states. That is, the step-down circuit according to the fifth embodiment is set so as to turn the first and second switching circuits SW1 and SW2 off after the initial step-down period by adjusting the values of the resistor R7 and the capacitance element C1. On the other hand, in the comparative example, it is not possible to put the first and second resistance units RP1 and RP2 into the low resistance states in a period of time that is immediately after the initiation of step-down. As a result of this, the discharge speed of the node VMONI is slow, and the node VMONI and the reference voltage VDC become the same at a time t2-0 which is later than the time t2.

Consequently, in addition to improving the step-down speed in the initial step-down period, the step-down circuit according to the fifth embodiment can return the first and second resistance units RP1 and RP2 to the normal resistance states after a fixed period of time has passed. As a result of this, after the fixed period of time has passed, it is possible to reduce a discharge and charge current that flows through the first transistor PT1, the first resistance unit RP1, the second resistance unit RP2 and the second transistor NT1 from the internal voltage VCC.

In addition, it is possible to configure such that a resistance ratio of the first resistance unit RP1 and the second resistance unit RP2 is the same in the normal resistance states as in the low resistance states by setting the ratio of the resistance values of the first resistor R1 and the second resistor R2 and the ratio of the resistance values of the third resistor R3 and the fourth resistor R4 to be the same ratio. As a result of this, it is possible to configure target values of the internal power-supply voltage VINT and the node VMONI as the same in the low resistance states and the normal resistance states of the first and second resistance units RP1 and RP2, and it is possible to simplify the circuit configuration.

(Sixth Embodiment)

Figure 13:
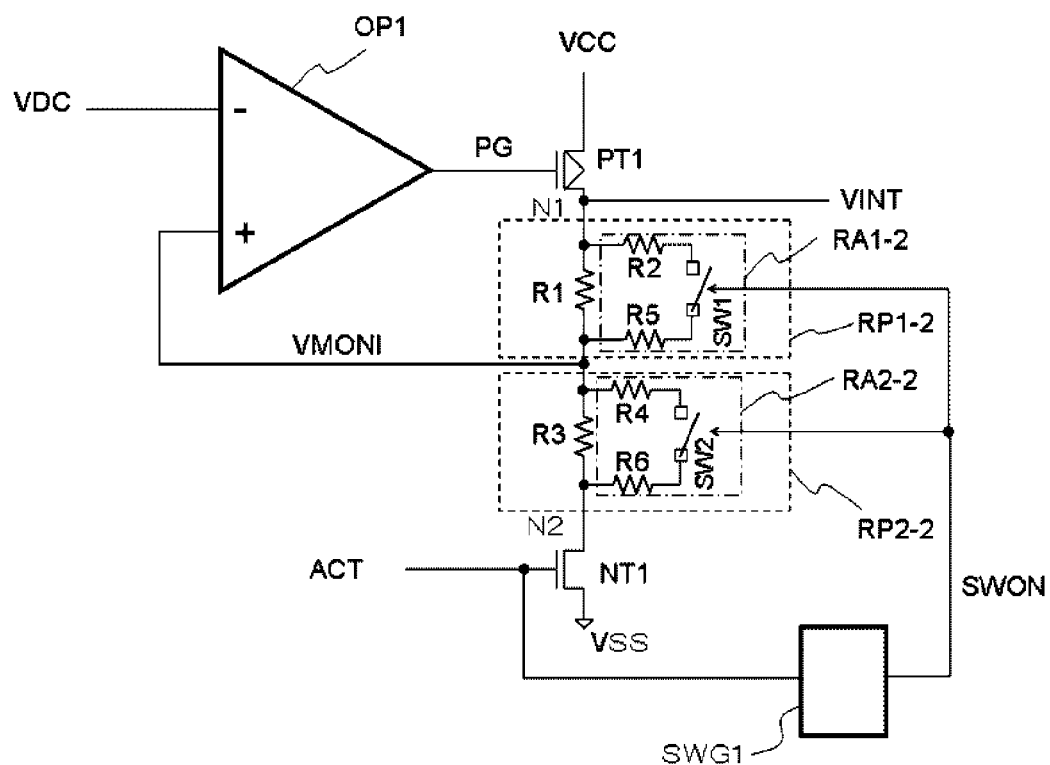
FIG. 13 is a circuit diagram of a step-down circuit according to a sixth embodiment.

An example of a circuit diagram of a step-down circuit according to a sixth embodiment is shown in FIG. 13. In the sixth embodiment, the configurations of the first and second resistance units differ from those of the fifth embodiment. Additionally, the descriptions of configurations which are the same as those of the first to fifth embodiments are omitted.

As shown in FIG. 13, a first resistance unit and a second resistance unit are the same as those in the second embodiment, and these units are the first resistance unit RP1-2 and the second resistance unit RP2-2 respectively. The other configurations thereof are the same as those of the fifth embodiment.

In the sixth embodiment, it is also possible to obtain the same effects as those of the fifth embodiment.

In addition, it can be said that the first switch SW1 is connected to the first resistance through the second resistor R2 and the fifth resistor R5. In the same manner, it can be said that the second switch SW2 is connected to the third resistance through the fourth resistor R4 and the sixth resistor R6. Accordingly, it is possible to absorb noise that is produced when the first switch SW1 and the second switch SW2 switch using the second resistor R2, the fourth resistor R4, the fifth resistor R5 and the sixth resistor R6. Accordingly, it is possible to reduce noise that is transmitted to the first resistor R1 or the third resistor R3. As a result of this, it is possible to further stabilize the step-down operation immediately after the time t2.

Modification Example of Resistance Adjustment Units

Figure 14:
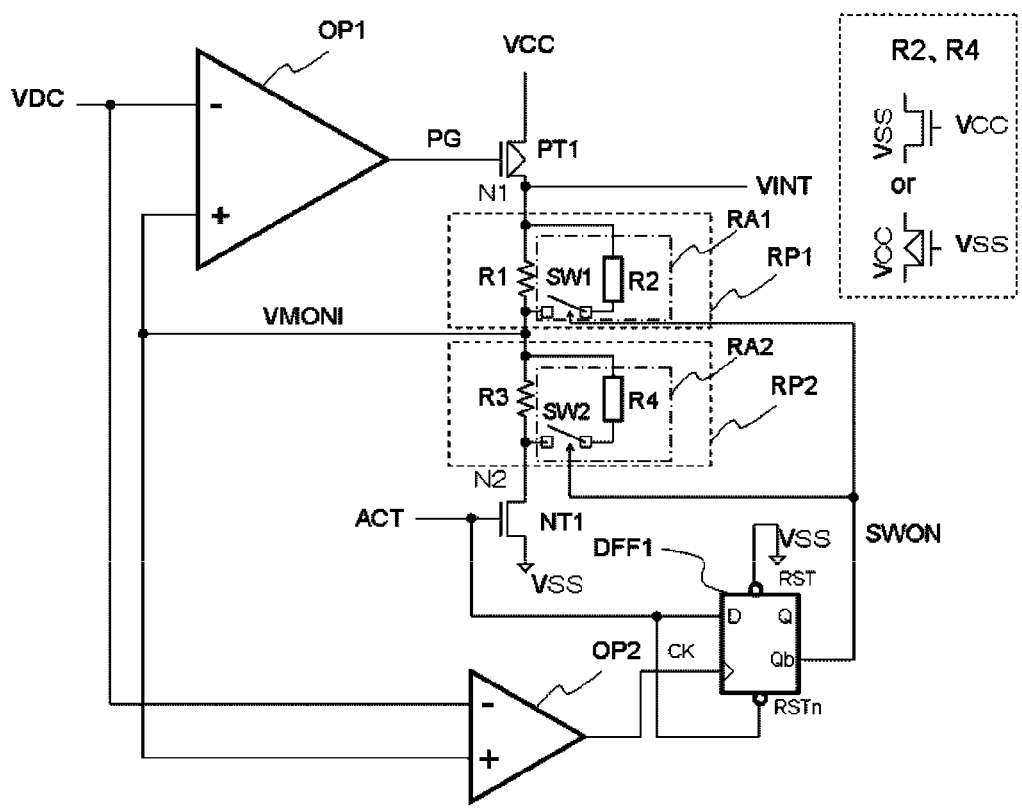
FIG. 14 is a circuit diagram of an example modification of a resistance adjustment unit.

A modified example of the resistance adjustment units is shown in FIG. 14 using a circuit diagram of the step-down circuit of FIG. 3. As shown in FIG. 14, the first resistor R2 and the second resistor R4 may use n-type transistors or p-type transistors.

For example, when the first resistor R2 is formed with an n-type transistor, a first end of the n-type transistor is connected to a side of the node N1, and a second end of the node of the n-type transistor is connected to a side of the node VMONI. In addition, the internal voltage VCC is applied to a gate electrode PG (control line) of the n-type transistor. Additionally, the ground voltage VSS is applied to a well of the n-type transistor. As a result of this, it is possible for the n-type transistor to function as a resistance (resistor). Additionally, when the second resistor R4 is an n-type transistor, a first end of the n-type transistor is connected to a side of a node electrode VMONI, and a second end of the n-type transistor may be connected to a side of the node N2.

When the first resistor R2 is a p-type transistor, a first end of the p-type transistor is connected to a side of the node N1, and a second end of the node of the p-type transistor is connected to a side of the node VMONI. In addition, the ground voltage VSS is applied to a gate electrode PG (control line) of the n-type transistor. Additionally, the internal voltage VCC is applied to a well of the p-type transistor. As a result of this, it is possible for the p-type transistor to function as a resistance (resistor). Additionally, in a case in which the second resistor R4 is a p-type transistor, a first end of the p-type transistor is connected to a side of a node electrode VMONI, and a second end of the p-type transistor may be connected to a side of the node N2.

In addition, the first resistor R2 may be an n-type transistor, and the second resistor R4 may be a p-type transistor. In addition, the first resistor R2 may be a p-type transistor and the second resistor R4 may be an n-type transistor. In addition, the first resistor R2 and the second resistor R4 may be wiring resistances that use wiring.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first transistor having a first end connected to an internal voltage terminal and a second end connected to a first node;
    a first resistance unit including:
        a first resistor connected between the first node and a monitor node, and
        a first resistance adjustment unit connected in parallel with the first resistor, the first resistance adjustment unit including a second resistor and a first switch connected in series;
    a second resistance unit including:
        a third resistor connected between the monitor node and a second node, and
        a second resistance adjustment unit connected in parallel with the third resistor, the second resistance adjustment unit including a fourth resistor and a second switch connected in series;
    a first comparator having an output terminal connected to a gate electrode of the first transistor and configured to compare a voltage of the monitor node to a reference voltage and output a control line voltage according to the comparison; and
    a resistance control circuit configured to control a conductance of the first switch and a conductance of the second switch on the basis of an operation initiation signal.

2. The device of claim 1, further comprising:
    a second transistor having a first end connected to the second node, a second end connected to a ground potential terminal, and a gate electrode configured to receive the operation initiation signal.

3. The device of claim 1, wherein the second node is connected to a ground potential terminal.

4. The device of claim 1, wherein the resistance control circuit comprises a D-type flip-flop circuit.

5. The device of claim 1, wherein a voltage of the first node is supplied to a voltage generation circuit in a memory device.

6. The device of claim 1, the first resistance unit further including a fifth resistor connected in series with the second resistor and the first switch.

7. The device of claim 6, wherein the first switch is connected between the second resistor and the fifth resistor.

8. The device of claim 6, the second resistance unit further including a sixth resistor connected in series with the fourth resistor and the second switch.

9. The device of claim 1, the second resistance unit further including a sixth resistor connected in series with the fourth resistor and the second switch.

10. The device of claim 9, wherein the second switch is connected between the fourth resistor and the sixth resistor.

11. The device of claim 1, further comprising a second comparator configured to compare the voltage of the monitor node and the reference voltage and output a signal to the resistance control unit.

12. The device of claim 1, wherein the resistance control unit comprises a pulse generation circuit and a delay circuit.

13. The device of claim 1, wherein at least one of the second resistor and the fourth resistor is a transistor.

14. The device of claim 13, wherein the transistor is an n-channel transistor with a gate electrode connected to the internal voltage terminal and a well connected to the ground potential.

15. The device according to claim 1, wherein the resistance control circuit is configured to turn off the first switch and the second switch after a first period of time after input of the operation initiation signal.

16. A voltage step-down circuit, comprising:
a first transistor having a first end connected to an internal voltage terminal and a second end connected to a first node;
a first resistor connected between the first node and a monitor node;
a first resistance adjustment unit connected in parallel with the first resistor, the first resistance adjustment unit including a second resistor and a first switch connected in series;
a third resistor connected between the monitor node and a second node;
a second resistance adjustment unit connected in parallel with the third resistor, the second resistance adjustment unit including a fourth resistor and a second switch connected in series;
a first comparator having an output terminal connected to a gate electrode of the first transistor and configured to compare a voltage of the monitor node to a reference voltage and output a control line voltage according to the comparison; and
a resistance control circuit configured to control a conductance of the first switch and a conductance of the second switch on the basis of an operation initiation signal.

17. The voltage step-down circuit of claim 16, wherein the resistance control circuit is a D-type flip-flop circuit.

18. The voltage step-down circuit of claim 17, wherein the resistance control unit is configured to open the first switch and the second switch after a first time period after the operation initiation signal has been supplied.

19. A semiconductor memory device, comprising:
a first transistor having a first end connected to an internal voltage terminal and a second end connected to a first node;
a first resistor connected between the first node and a monitor node;
a first resistance adjustment unit connected in parallel with the first resistor, the first resistance adjustment unit including a second resistor, a first switch, and a fifth resistor connected in series;
a third resistor connected between the monitor node and a second node;
a second resistance adjustment unit connected in parallel with the third resistor, the second resistance adjustment unit including a fourth resistor, a second switch, and a sixth resistor connected in series;
a first comparator having an output terminal connected to a gate electrode of the first transistor and configured to compare a voltage of the monitor node to a reference voltage and output a control line voltage to a gate electrode of the first transistor according to the comparison; and
a resistance control circuit configured to control a conductance of the first switch and a conductance of the second switch on the basis of an operation initiation signal.

20. The semiconductor memory device of claim 19, wherein a ratio of a sum of resistance values of the second resistor and the fifth resistor to a resistance value of the first resistor is the same as a ratio of a sum of resistance values of the fourth resistor and the sixth resistor to a resistance value of the third resistor.

* * * * *